United States Patent [19]

Fennell et al.

[11] Patent Number: 4,872,847
[45] Date of Patent: Oct. 10, 1989

[54] PILFER PROOFING SYSTEM FOR ELECTRIC UTILITY METER BOX

[76] Inventors: Robert B. Fennell, 241 Deerfield Rd., Bloomingdale, Ga. 31302; David H. Fritts, 142 Jefferson St., Savannah, Ga. 31412; David S. LeGasse, P.O. Box 99, Walpoles, N.H. 03608

[21] Appl. No.: 162,517

[22] Filed: Mar. 1, 1988

Related U.S. Application Data

[60] Continuation-in-part of Ser. No. 98,699, Sep. 18, 1987, abandoned, which is a continuation-in-part of Ser. No. 694,368, Jan. 24, 1985, Pat. No. 4,615,113, which is a division of Ser. No. 526,236, Aug. 25, 1983, Pat. No. 4,505,530, which is a division of Ser. No. 170,205, Aug. 18, 1980, Pat. No. 4,404,521.

[51] Int. Cl.$^4$ .............................................. H01R 13/52
[52] U.S. Cl. .................................................. 439/133
[58] Field of Search ............... 439/133, 146, 148, 301, 439/304, 517, 651, 655, 839; 324/110; 361/369–373

[56] References Cited

U.S. PATENT DOCUMENTS

| | | | |
|---|---|---|---|
| 2,071,936 | 2/1937 | Mylius | 339/198 M |
| 2,105,884 | 1/1938 | Hanser et al. | 339/259 R |
| 2,359,628 | 10/1944 | Daly | 324/110 |
| 3,076,953 | 2/1963 | Sloop | 339/259 F |
| 3,152,857 | 10/1964 | Fisher | 339/259 F |
| 3,614,708 | 10/1971 | Koepfgen | 339/36 |
| 4,052,118 | 10/1977 | Scheingold et al. | 339/17 CF |
| 4,090,769 | 5/1978 | Damsky | 339/166 R |
| 4,121,147 | 10/1978 | Becker et al. | 361/369 |
| 4,175,813 | 11/1979 | Mentesana | 324/110 |
| 4,314,738 | 2/1982 | Davis et al. | 361/369 |
| 4,368,943 | 1/1983 | Davis et al. | 339/198 M |
| 4,404,521 | 9/1983 | Fennell | 361/369 |

OTHER PUBLICATIONS

"A Snap to Install . . . ", Promotional Flyer, Apr. 1985.

Primary Examiner—Joseph H. McGlynn
Attorney, Agent, or Firm—Jim Zegeer

[57] ABSTRACT

A pilfer proofing system for electric meter boxes having a meter base box which carries a plug-in terminal block set and a meter box cover having an opening through which a plug-in meter passes to engage contact female or socket terminals in a terminal block set. A contact terminal block adaptor carrying insulating cages frictionaly retained in the female socket terminal of the contact block set springs are included in the female socket terminals to assure continuous electrical contact and avoid hot spots. The meter box has a pair of lateral meter stops which are clamped between one end of an annular, cast aluminum ring and a pair of insulated, bifurcated clamp bars positioned behind the meter stops which, in turn, are secured to a common metal bar housed in a recess in the adaptor. The illustrate clamp bars have bifurcated ends which more evenly distributes the mechanical forces to the meter box by providing a plurality of distributed contact or load distribution points instead of one. An annular flange on the aluminum ring seals the edges of the existing opening in the meter cover thereby preventing surreptitious access to the interior of the meter box housing and, at the same time, clamping the rest of the meter cover securely to the box with the bifurcated clamp bars providing the plurality of distributed contact points.

11 Claims, 6 Drawing Sheets

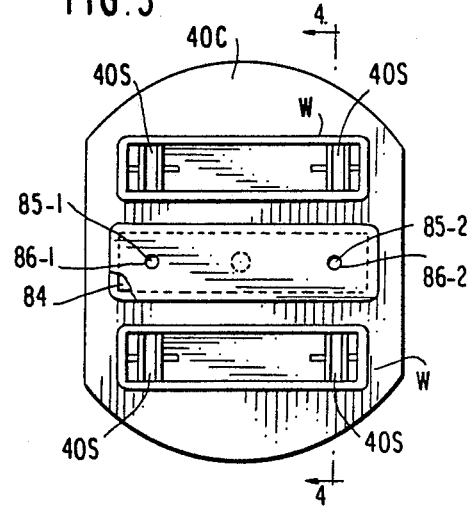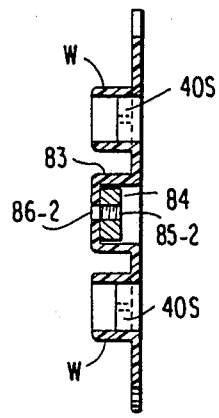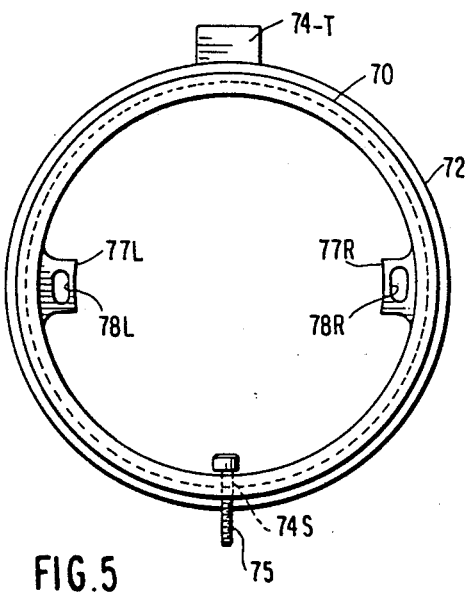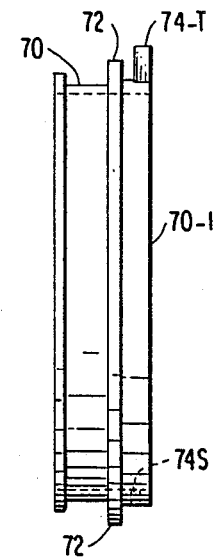

FIG. 9
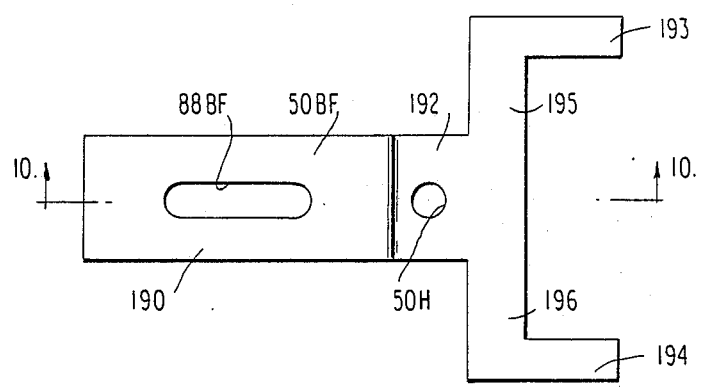
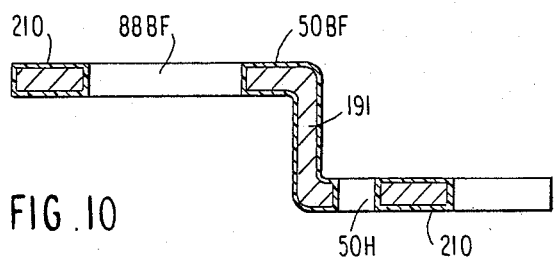
FIG. 10
FIG. 11
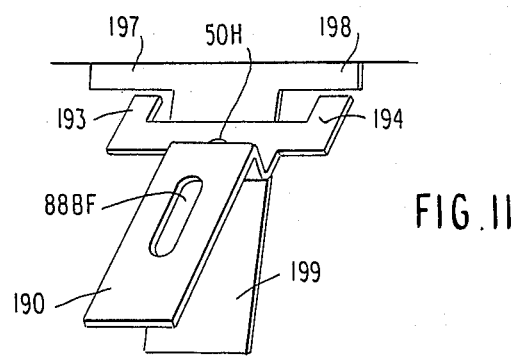

PILFER PROOFING SYSTEM FOR ELECTRIC UTILITY METER BOX

REFERENCE TO RELATED APPLICATIONS

This application is a continuation-in-part of U.S. application Ser. No. 098,699 filed Sept. 18, 1987, now abandoned, entitled "Pilfer Proofing System For Electric Utility Meter Box" which is a continuation-in-part of U.S. application Ser. No. 694,368 filed Jan. 24, 1985, entitled "Pilfer Proofing System And Method For Electric Utility Meter Box", now U.S. Pat. No. 4,615,113 which is a division of U.S. application Ser. No. 526,236 filed Aug. 25, 1983, now U.S. Pat. No. 4,505,530 which, in turn, is a division of U.S. application Ser. No. 170,205 filed Aug. 18, 1980, now U.S. Pat. No. 4,404,521, all of which are incorporated herein by reference.

BACKGROUND AND BRIEF DESCRIPTION OF THE INVENTION

In the above-referenced patent application and U.S. Pat. No. 4,404,521, 4,505,530, and 4,615,113 there is disclosed a pilfer proofing system and method for electric utility meter boxes which adapts existing ringless-type meter boxes to locking ring-type meter boxes without disconnecting the box from the incoming power lines. An objective of the present invention is to provide an improved pilfer proofing system that does not require the serviceman to drill any holes and which is faster and easier to install than the system disclosed in the above patents while retaining the key feature of being able to install the pilfer proofing system and convert the ringless-type meter boxes to a locking ring-type meter box without disconnecting the box from the incoming power lines e.g., while the meter box is electrified. According to this invention, a plug-in meter contact terminal block set adaptor as disclosed and claimed in the above U.S. Pat. No. 4,505,530 is used to carry an embedded metal bar which is secured to a pair of short meter stop clamp bars so as to expeditiously properly position the clamp bars behind the meter stops. A feature of the present invention is that the clamp bars, in one preferred embodiment, have bifurcated ends which slide under "Tee"-type meter stops, and also are coated with an electrical grade epoxy or PVC insulation. The bifurcation of the ends of the clamp bars provides a four point contact system for clamping the cover to the meter box and thereby enhances the security of the system, while at the same time, enlarging the types and range of meter boxes which can be safely, easily and quickly pilfer proofed by the invention at very low cost.

A cast aluminum ring having an end adapted to abut the meter stop in the same way that the conventional meter abuts the meter stops, passes through the meter opening in the meter box cover to engage the meter stops and a pair of inwardly projecting lugs, integrally molded with the ring, are provided with elongated slots or holes through which pass locking bolts which engage threaded bores in the locking clamps. While the aluminum ring may be coated with an insulating coating, it is also grounded to the metal box. In another embodiment, the ring is a molded plastic element. When the bolts passing through the elongated slots in the cast aluminum ring are tightened, the meter stops are securely clamped between the metal clamp bars and the inner-most end of the annular ring. In the case of the bifurcated clamp bar ends, the end bifurcation may project under the cover edge at the meter opening so the clamp action may include that portion of the cover bounding the meter opening. The ring is provided with an enlarged annular flange which completely seals the opening in the meter box cover to prevent any surreptitious access thereto and a locating tab and set screw facilitate positioning the ring in place in the cover. Then the meter is plugged into the terminal block adaptor set and the locking ring or sealing band is applied over the shoulder of the meter itself and a locking flange on the cast annular ring to thereby lock and seal the meter to the projecting meter collar and flange. The operation can be done fast (about 3 minutes) and inexpensively, and there are no screws or drilling required to perform the installation. As noted above, the bifurcated clamp bar ends provide a four point contact with the meter stops and/or the edge of the meter box. Moreover, no special tools are required for installation, which can be done on a "live" meter box (no time is spent disconnecting service to the pole).

Accordingly, the basic objective of the invention is to provide an improved pilfer proofing apparatus and method following the teachings of the above-identified related applications, which can be installed by the serviceman fast and inexpensively with only a screwdriver.

BRIEF DESCRIPTION OF THE DRAWINGS

The above and other objects, advantages and features of the invention will become more apparent when considered in conjunction with the following specification and accompanying drawings wherein:

FIG. 3 is a top plan view of the insulated carrier for the contact block socket adaptor assembly, FIG. 4 is a sectional view on lines 4—4 of FIG. 3, FIG. 5 is a plan view of the adaptor, FIG. 6 is a side view thereof, FIG. 9 is a top plan view of a bifurcated chamber which can be used for meter boxes having "Tee"-type meter stops, FIG. 10 is a sectional view on lines 10—10 of FIG. 9, FIG. 11 is a perspective view showing how the bifurcated clamp bar slides under the "Tee"-type meter stop.

DETAILED DESCRIPTION OF THE INVENTION

Figure 1:
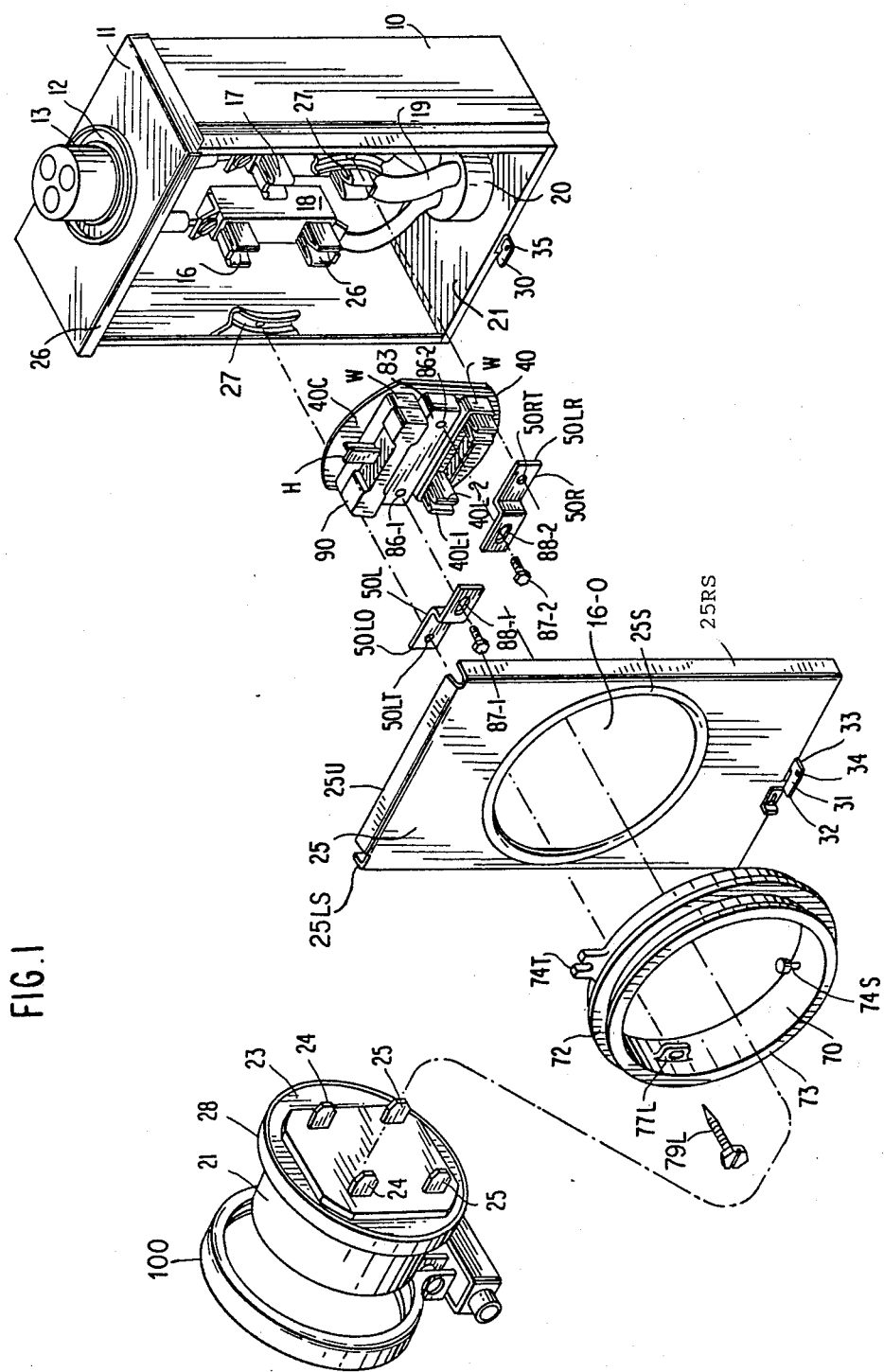
FIG. 1 is an exploded perspective view of a pilfer proof meter box incorporating the invention.

In the exploded perspective view of FIG. 1, an existing sheet metal meter box 10 has an input power cable 13 passing through gland 12 on the top 11 of box 10 with the electrical cables connected to the female contact jaws 16 and 17 of terminal block set 18 mounted on commercial base of box 10. Power to the user, which may be a home or commercial establishment, is supplied through conductors 19 which pass through a bottom gland 20 in the bottom 21 of box 10. With the meter 23 plugged-in with its upper male contacts 24 received in the female terminals 16 and 17 and the lower male terminals 25 plugged into the lower female terminals 26 [and 27] of the terminal block set 15, electrical power flows in through the conductor cable 13 through meter 23 and out through cable 19 to the user. The meter box cover 25 has an upper edge 25U sliding under a peripheral flange 26 on the top of box 10. Depending flanges or skirts 27 which fit over and closes off the edges of the two sidewalls and bottom wall of the meter box enclosure 10.

Service to a customer may be terminated for various reasons. Various forms of insulated disconnect sleeves DS, as disclosed in U.S. Pat. No. 2,643,362 and 3,528,049, may be placed on the load sides of the male contact blades so that when the meter is plugged into the female sockets 16, 17 of the terminal block set 18, the customer will be prevented from receiving electrical power.

In the usual case, prior to fitting the cover plate 25 onto the meter box 10, the meter unit 23 which has the rearwardly projecting contact blades 24,24 and 25,25 is plugged into the female contact jaws 16, 17 and 26, 27 in the terminal block set 18 as described above. A pair of meter stops 26 and 27 are secured to the sidewalls of meter box 10 by rivots or, preferably by welding. An annular shoulder 28 is formed at the base of glass cover 21 and a corresponding raised shoulder 25S is formed in the cover 25 so that when the cover 20 is fitted on the box 10, the glass meter cover 23 projects through the opening bounded by the flange 29 and annular shoulder 25S engages shoulder 28 to thereby retain the meter in place. A tongue 30 is secured to the bottom wall of meter box 10, and projects through a slot 31 in cover 25. A slide 32 secured to cover 25 has a projecting tongue 33 which has an aperture 34 which aligns with an aperture 35 in tongue 30. Slide 32 is positioned so that the two apertures 34 and 35 align and a safety seal (not shown) is used to provide an indication of tampering.

As noted in the above related patents and related applications, in the past, those electric utility customers who have a proclivity to pilfer electricity have found it very easy to tamper with the safety seal (making it appear as if no tampering had taken place or easily disclaiming responsibility for the tampering) and easily gain access to the meter and tamper with same in various ways so as to bypass the meter and thereby inaccurately portray their actual electricity usage. In order to avoid this tampering, the invention utilizes essentially three components:

I. a terminal block adaptor 40,
II. a pair of clamp bars 50L and 50R having bifurcated ends, and
III. an annular locking flange assembly 70.

Figure 7A:
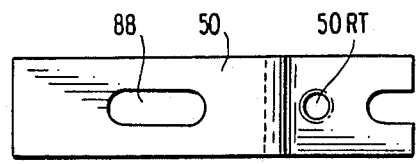
FIG. 7a is a top plan view of clamp bars.
Figure 7B:
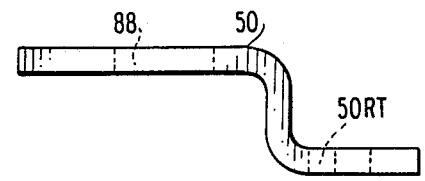
FIG. 7b is a side elevational view thereof.

The contact terminal block adaptor 40 is similar in all major respects to the contact terminal block adaptor disclosed in the above-mentioned Fennell patents. The contact block adaptor 40 includes a molded insulating plastic carrier 40C (FIG. 3; FIG. 4) which has a central pocket portion 83 in which is received a steel bar 84 that has a pair of bored and tapped holes 85-1, 85-2 aligned with holes 86-1 and 86-2 in the base of the pocket 83. A pair of clamp brackets 50L and 50R (shown in detail in FIGS. 7a and 7b) are secured in position on the bottom of pocket 83 by screw fasteners 87-1, 87-2 which pass through elongated slots 88-1 and 88-2, holes 86-1 and 86-2 and in threaded engagement with bored and tapped holes 85-1 and 85-2 to thereby adjustably mount brackets 50L and 50R on the adaptor 40. Brackets 50L and 50R have a shape such that their outermost ends 50LO and 50RO fit behind meter stops 26 and 27, respectively with a short straight section carrying a threaded and tapped holes 50LT and 50RT, the purpose of which will be described more fully hereafter.

Since one of the prime objectives of the invention is to be able to pilfer proof a box while it is still connected to the line without danger to the serviceman, the upper female contacts 82, 83 in the adaptor 40 are protected by a safety shield 90 (FIG. 8) which in conjunction with walls or barriers W insulates these "hot" (electrically) conductor elements during the pilfer proofing operation. Safety shield 90 (which is functionally similar to the safety shield shown in the above related patents) has a pair of non-conductive blade members 90B for frictionally retaining the shield in place in the hot conductor elements while the clamp brackets 50L and 50R are being installed in the manner described above. The plastic cover or cap 90 in this case can be similar in construction to the meter disconnect device disclosed in U.S. Pat. No. 3,614,708 and has a handle H thereon for safe and easy removal of cover 90 after the installation of the pilfer proofing adaptations. The clamp brackets 50L and 50R are installed after the adaptor has been plugged through the opening 16-0 in cover plate 16. It is an aspect and feature of this invention that the cover 16 can remain in place during all or a portion of the modification of the meter box to pilfer proof same. Of course, since it is a ringless type meter box, the cover must be removed in order to unplug the meter from the terminal block set.

After the clamp brackets 50L and 50R have been installed with the legs or arms thereof positioned behind the meter stop brackets 26 and 27, a cast aluminum ring 70 having a first annulus portion 110-1 which rests upon meter stops 26 and 27, an annular flange 72 which abuts on the outer annular rib 25S of cover 25 and thus seals this space against surreptitious entry, and at outer annular ring 73 of smaller diameter than flange 70 for engagement with the base of the meter 20 so that when the clamping ring 90 can be applied thereto. A tab 74-T is integrally formed with the ring 70 projects downwardly on the inside behind the cover 25 and a threaded screw 75 threadably engaged with tapped hole 75 has a shank portion 74-1 which projects behind the front surface of panel 25 to thereby serve as an additional positioning element for ring 70.

Figure 2:
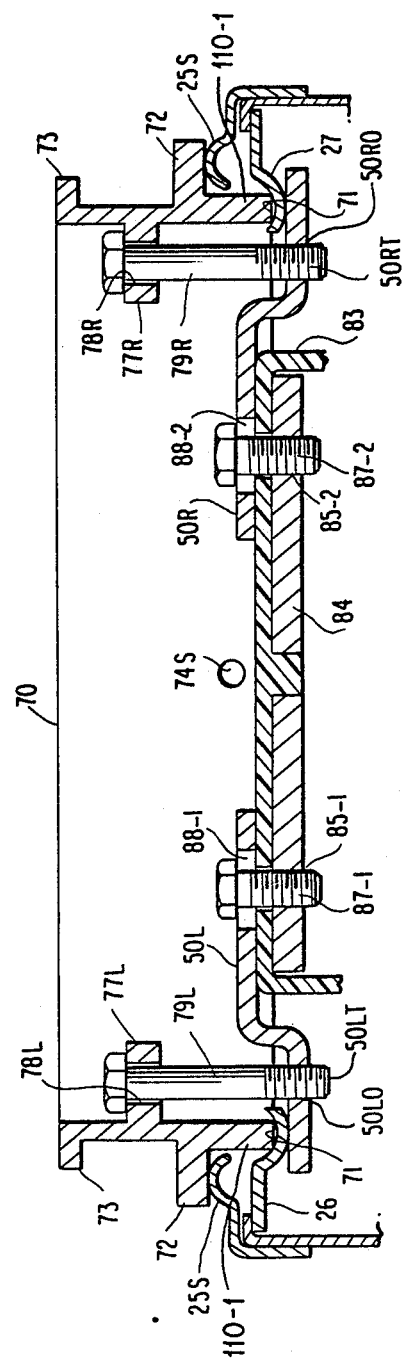
FIG. 2 is a section line through a portion of the meter box showing the clamping or locking end of the adaptor components to the meter stops.

The inner periphery of the ring at the 3 and 9 o'clock positions thereof (FIG. 5) is provided with a pair of internally projecting lugs 77-L and 77-R which have elongated slots 78-L and 78-R through which long bolts 79-L and 79-R (FIG. 2) pass to threadably engage with threaded and tapped holes 50-LO and 50-RO in clamp bars 50L and 50R, respectively, so that when these bolts are tightened, the meter stop brackets 26 and 27 are tightly clamped between the lower edge of ring 70 and the legs of the clamp bars 50 as shown clearly in FIG. 2. Meter cover 25 is thus secured against surreptitious opening and when the meter is in place there are no exposed screws or other fasteners which would permit easy access by those with a proclivity to pilfer electricity.

After the securely tightening of these screws, the screws 87L and 87R may then be tightened by screwdriver or a coin. After this is done, the protective safety shield 90 is removed and the meter then can be plugged into the female socket elements of the adaptor 40 and the locking ring 100 then clamp to the ring 75.

As noted above, if the customer is to be prevented from using electricity from the utility, a pair of insulated sleeves disconnects may be placed on the load side of the meter made connectors so that when the meter is replaced, the insulation sleeves prevent current flow to the customer.

Figure 8:
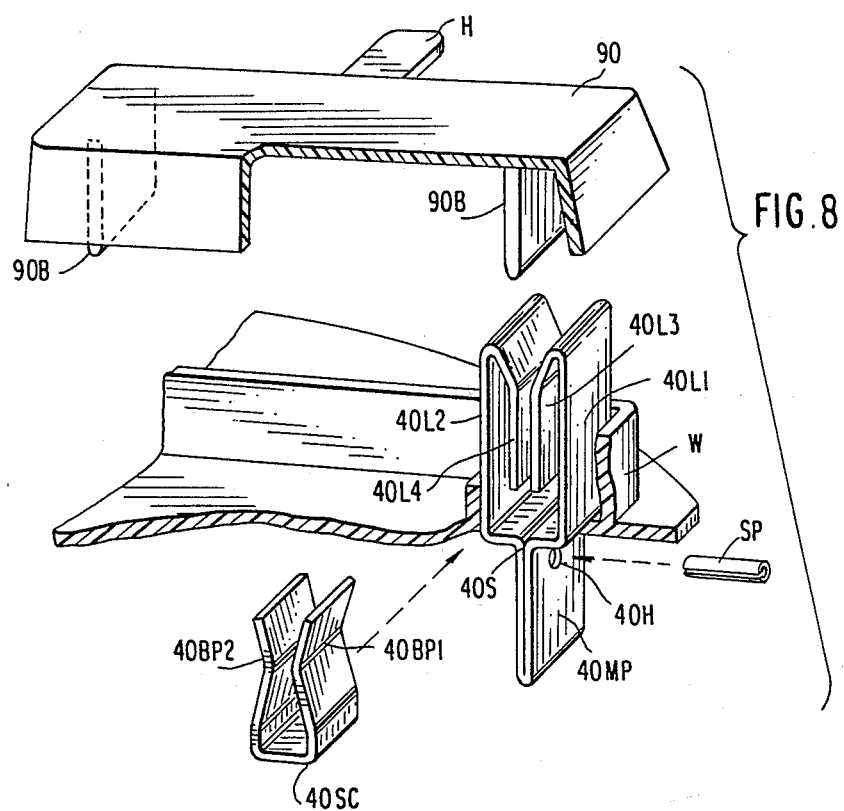
FIG. 8 is a perspective view of the male-female elements carried by the contact set block adaptors.

As shown in FIG. 8, the female-male contacts are formed of a single copper bar which has been folded approximate the center to form the male prongs 40MP which pass through slits 40S of insulating molded carriers 40 and within the lateral ends of wall W. A spring clip 40SC is inserted between the legs 40L1 and 40L2 such that the spring bearing points 40BP1 and 50BP2 bear on contact legs 40L3 and 40L4. When the male contacts 24,24 and 25,25 of the meter are inserted into the contact 40 and force the legs 40L3 and 40L4 apart, the spring clip is loaded and maintain a uniform pressure and avoids hot spots, etc. A spring pin SP passes through a hole 40H in the male plug side to retain the male/female plug in place; wall W provides some support for this male/female plug element.

The locking ring or sealing ring 90 is applied over the shoulder on the glass cover of the meter and the locking flange 73 to thereby lock and seal the meter to the projecting collar 72 in flange 73. Thus, the meter cannot be removed without a key and/or otherwise damaging the unit to gain access to the meter and thereby pilfer electricity. The locking ring and its locking elements are conventional and are fully disclosed in Mylious Pat. No. 2,071,936. These devices include case hardened steel materials to resist cutting and hacksawing and in addition to accepting pad locks and other type of hard locking devices can also accept lead wire safety seals and the like for soft forms of protection.

It will be appreciated that the objects of the invention have been satisfied in that no screw holes are required to be drilled for installation purposes and installation can take place in a short number of minutes because all that is required is (1) the removal of the meter and the ringless box cover, (2) insertion of the contact block adaptor with the protective covers in place, (3) attachment of the metal clamping bars to the adaptor, (4) replace the ringless box cover and position the cast aluminum ring 70 and secure same to the metal bars by the screws, (5) remove the protective covers from the female socket elements, (6) replace the meter (with or without the insulated disconnect sleeves DS), and (7) install the locking band.

Figure 12:
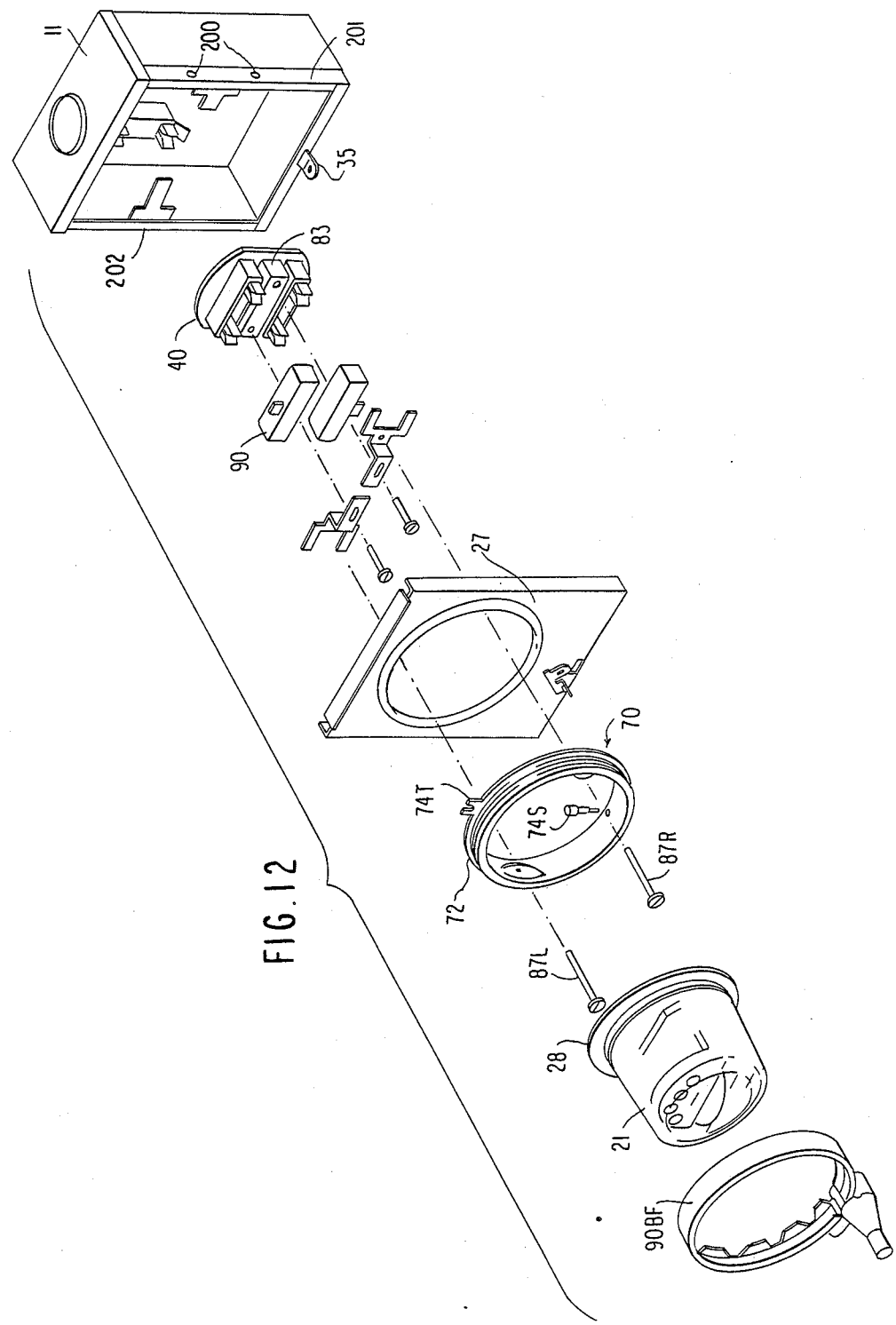
FIG. 12 is an exploded view showing the installation with the bifurcated clamp bars.

In some ringless meter boxes, the meter stop has a "Tee" shape (sometimes referred to as "Tee-type" meter stops. Referring to FIGS. 8 and 9, the bifurcated clamp bars 50BF have a flat body portion 190 which has an elongated slot 88BF through which screws or bolts 87-1 or 87-2 pass for engagements with threaded bore holes 85-1 or 85-2, respectively, in the steel bar 84 which is embedded in the insulated recess 83. The elongated slots 88BF permit the easy adjustment of the bifurcated clamp bars. The clamp bars are provided with a short angulated shank portion 191 and a common leg 192 which has a threaded perforation 50BF. Perforations 50BF are adapted to receive bolts 87L and 87R, respectively, passing through lug 72L and 72R on the locking ring collar 70. Bifurcation legs 193 and 194, respectively are joined to leg 192 by short extending members 195 and 196, respectively. The lengths of bifurcation legs 193 and 194 are such that they project outwardly and may be slid under the arms 197, 198 of the Tee-type meter stop 199. The arms 197 and 198 are secured by rivots 200 to the side edges or vertical ribs 201, 202 of meter box 11 and may actually slide under the edges or vertical ribs 201, 202. The clamp bars have an insulating coating 210 which is an electrical grade of an epoxy or PVC insulation 210 and which extends into and encloses the side openings of the slots 88BF and hole 50BF, it being appreciated that hole 50BF has a threaded opening which is for the purpose of receiving clamp screws 87L and 87R. As illustrated in the exploded view of FIG. 12, clamp screws 87L and 87R pass through openings in lugs in the locking ring and threadably engage with threaded holes 50BF so that when these clamping bolts 87 are tightened by a screwdriver, for example, the clamp bars bifurcated ends 193, 194 are spaced apart and bear at two spaced points on the undersides of the Tee legs 197, 198 and the edges 201 and 202 to more uniformly draw the annular flange 72 of the locking ring 70 tightly against the peripheral portions of cover 27 bounding meter opening 25S so as to tightly clamp the cover 27 shut with meter box 11. The meter then may be installed with or without the insulating sleeve disconnects and locked to the meter box with the locking ring 90. The locking ring 90 differs slightly from the locking ring shown in FIG. 1 in that the lock projects outwardly. However, both locking rings are commercially available for use with the present invention.

Thus, the spacing of the bifurcated ends essentially provides a four-point engagement of the anchor bars with the meter stops and vertical edges of the meter box thereby providing a more balanced and improved securement and clamping of the cover and locking collar to the meter box per se. In addition, the insulating coating provides added safety to the installer as well as insurance against accidental contact of the internal metal parts with the "live" or "hot" wires to the anchor bars and thence to the meter box and meter box cover therefor and is a form of double insulation of the external metal parts relative to the pilfer proofing components added by this invention.

While the invention has been particularly designed for pilfer proofing electric utility boxes while they are still connected to the electrical system, it will be appreciated that they can be applied to boxes prior to installation as a conversion kit. While there has been illustrated and described a preferred embodiment of the invention, it will be apparent to those skilled in the art that many modifications may be made without departing from the spirit and scope of the invention as set forth in the following claims:

What is claimed is:

1. In a pilfer proofing apparatus for a plug-in utility meter and base box of the type having a meter base box, a pair of meter stops fastened to said base box at diametrically opposite sides of said opening through which said glass meter cover normally projects, a plug-in electric meter having a glass meter cover, rearwardly projecting male connectors and an annular flange, a plug-in terminal block set and a meter box cover having an opening therein through which said glass meter cover of said electric meter passes to plug and engage said rearwardly projecting male connectors in said terminal block set to pilfer proof same without electrically disconnecting the meter base box and terminal block set from the electrical power line, said pilfer proofing apparatus including, (a) rigid insulated carrier means, a plurality of male conductor plug elements projecting on one side of said insulated carrier means, and a like numbered plurality of female conductor socket elements, each integrally formed with a respective one of said male conductor plug elements and projecting from the opposite side of said carrier member, (b) a locking ring member constituted by a meter box cover engaging member and in integral annular locking ring projection projecting outwardly from the plane of said meter box cover engaging member and through said opening in said meter box cover, (c) anchor means adapted to be secured to said meter base box, said anchor means including a pair of insulated anchor bars having means for adjustably securing first ends of said anchor bars to said insulated carrier means, and second ends of said anchor bars having bifurcated ends with bifurcations spacedly projecting under said meter stops at said diametrically opposite sides of said opening to accommodate a wider variety of meter boxes and form a plurality of bearing points for engagement with said meter stops and better distribute the load on said meter box cover and make it more difficult to defeat by a would-be pilferer, (d) screw means fully passing through said locking ring member to threadably engage with threaded bores in said anchor bars to clamp said locking ring and said meter box cover to said meter stops with each spaced bifurcation providing a of bearing point on said meter stops for each anchor bar, (e) removable insulated blade members releasably retained in at least electrically energized ones of said female conductor socket elements during the installation of elements (b), (c) and (d), and (f) an annular locking ring means engaging said annular flange on the base of said meter and said locking ring projection for securing said meter to said locking ring member and meter base box whereby said projecting male connectors are prevented from being unplugged from said contact terminal block set and said meter base box without removing said annular locking ring.

2. The pilfer proofing apparatus defined in claim 1 wherein each said anchor bar is metal and has an insulating coating thereon.

3. The pilfer proofing apparatus defined in claim 1 wherein each said meter stop is "Tee" shaped with the stem of the "Tee" projecting into said opening in said meter box cover and said bifurcations straddle said stem and project under the cross of said "Tee", fastener screws, said fastener screws, passing through holes in said locking ring member into said threaded bore in said anchor bar member to cause said locking ring member meter box cover engaging member and bifurcated ends are clamped to said cover.

4. Pilfer proofing apparatus for a plug-in utility meter and box of the type having a meter base box, a plug-in electric meter having a glass meter cover, rearwardly projecting male connectors and an annular flange, a plug-in contact terminal block set and a meter box cover having a flat plane surface an opening in said flat plane surface through which said glass meter cover of said electric meter passes to plug and engage said rearwardly projecting male connectors in said terminal block set, to pilfer proof same without electrically disconnecting the meter base box and terminal block set from the electrical power line, said utility meter and box includes a pair of "Tee" shaped meter stops with the cross of each "Tee" being fastened to said base box at diametrically opposite sides, respectively, of said opening in said meter box cover through which said glass meter cover normally projects with the stem of each "Tee" projecting inwardly of said opening, comprising (a) a terminal block set adaptor means comprising a rigid insulating carrier means having a vertical axis, a plurality of copper male conductor plug elements projecting on one side of said insulating carrier means, a like numbered plurality of female conductor socket elements each integrally formed with a respective one of said copper male conductor plug elements and constituted by a pair of opposing members having abutting facing legs projecting from the opposite side of said rigid insulating carrier means, and a spring member urging said abutting facing legs toward each other, an elongated steel plate member embedded in said rigid insulating carrier means in a direction transverse to said vertical axis of said rigid insulating carrier means, (b) said insulating insulating carrier means further including raised endless rigid insulating wall means projecting outwardly from the surface of said rigid insulating carrier means and straddling the vertical axis thereof and substantially surrounding the same female socket conductor elements, and a cap member corresponding to said raised endless wall, insulated blade members projecting inside said cap member so that when said insulated blade members are frictionally retained in said female conductor socket members surrounded by one of said raised endless insulating wall means, said cap member and said one of said raised endless insulating walls fully protecting the installer while said apparatus is being installed on an electrified plug-in utility meter box, (c) an annular locking ring collar member constituted by a meter box cover engaging member, an integral tab for projecting behind said meter box cover at one point thereon, and integral annular locking ring collar projecting outwardly from said flat plane surface of said meter box cover engaging member and through said opening in said meter box cover, said annular locking ring collar member having a radially extending flange which fully covers the edge of said meter box opening adjacent said annular locking ring collar member to prevent surreptitious entry to said meter box, (d) a pair of insulated clamp bars adapted to be adjustably secured to said terminal block set adaptor, and anchor means including said elongated steel plate embedded in said rigid insulating carrier member, and proximate the center thereof so that when said terminal block set adaptor is plugged into said terminal block set, said elongated steel plate is substantially aligned with said meter stops, each said insulated clamp bar has an inner end and an outer end, said inner ends being adjustably secured to said elongated steel plate embedded in said insulating carrier means, and said outer ends being bifurcated with legs of the bifurcations straddling the stem of their respective "Tee" shaped meter stop so that each bifurcation forms a bearing path for engagement with said meter box cover and more uniformly distribute the load thereon and make it more difficult to defeat by a would-be pilferer,
(e) means securing said locking ring collar member to said anchor means to thereby clamp each said meter stop between said pair of clamp bars and the innermost end of said locking ring collar member,
(f) an annular locking ring means engaging said annular flange on the base of said meter and said locking ring collar member for securing said meter to said locking ring collar member and meter base box whereby said projecting male connectors are prevented from being unplugged from said plug-in contact terminal block set and said meter base box without removing said annular locking ring collar member.

5. Pilfer proofing apparatus for a plug-in utility meter and box of the type having a meter base box, a plug-in electric meter having a glass meter cover, rearwardly projecting male connectors and an annular flange, a plug-in terminal block set and a meter box cover having an opening therein through which said glass meter cover of said electric meter passes to plug and engage said rearwardly projecting male connectors in said terminal block set pilfer proof same without electrically disconnecting the meter base box and terminal block set from the electrical power line, said utility meter box includes a pair of meter stops fastened to said base box at diametrically opposite sides of said opening through which said glass meter cover normally projects, comprising,
  (a) a terminal block set adaptor means comprising a rigid insulating carrier means,
    a plurality of copper male conductors plug elements projecting on one side of said insulating carrier means, and
    a like numbered plurality of female conductor socket elements, each integrally formed with a respective one of said male conductor plug elements and
    constituted by a pair of opposing members having abutting facing legs and projecting from the opposite side of said carrier member, and a spring member urging said abutting facing legs toward each other,
  (b) a locking ring collar member constituted by a meter box cover engaging member, an integral tab for projecting behind said meter box cover at one point thereon, and integral annular locking ring collar projecting outwardly from the plane of said meter box cover engaging member and through said opening in said meter box cover, said annular locking ring having a radially extending flange which fully covers the edge of said meter box opening adjacent said locking ring to prevent surreptitious entry to said meter box,
  (c) an insulated steel plate embedded in rigid insulating carrier member, and proximate the center thereof so that when said adaptor is plugged into said terminal block set, said steel plate is substantially aligned with said meter stops, a pair of insulated clamp bars adapted to be secured to said steel plates embedded in said terminal block adaptor means, said insulated clamp bars having bifurcated ends to distribute the load on said meter box cover over a plurality of points for each said clamp base,
  (d) screw elements passing through holes in said locking ring collar member and threadably engaged with bore holes in said pair of insulated clamp bars for drawing said locking ring member to said outer cover and clamp each said meter stop and outer box cover between said bifurcated ends of said pair of clamp bars and the innermost end of said locking ring to thereby secure said meter box cover to said meter box,
  (e) an annular locking ring means engaging said annular flange on the base of said meter and said locking ring collar for securing said meter to said locking ring and meter base box whereby said projecting male connectors are prevented from being unplugged from said contact terminal block set and said meter base box without removing said annular locking ring.

6. Apparatus as defined in claim 5 further including raised endless insulating wall means projecting outwardly from said flat planar carrier and substantially surrounding the said pairs of female socket conductor elements, and a cap member corresponding to said raised endless wall, insulated blade members projecting inside said cap member so that when said insulated blade members are frictionally retained in a pair of said female socket members surrounded by one of said endless insulating walls, said cap and said one of said endless walls fully protecting the installer while said apparatus is being installed on an electrified plug-in utility meter box.

7. An anchor member for use in pilfer proofing a plug-in utility meter and box of the type having a meter base box, a plug-in terminal blade set secured to a base plate of said meter base box, and a terminal block set adaptor for extending said terminal block set from said meter base box, a pair of meter stops secured to said base box at diametrically opposite sides thereof, a cover having an opening for said utility meter, and a locking ring collar passing through said opening in said cover, said anchor member having:
  a pair of ends, a first of said ends having spaced bifurcations for engagement with said meter stops to thereby provide a plurality of bearing points spaced relative to the opening in said cover,
  a second of said ends having an elongated slot formed therein for adjustable securement in said base box,
  an offset connecting said first and said second ends of said anchor member,
  an anchor member for use in pilfer proofing a plug-in utility meter and box of the type having a meter base box, a pair of meter stops secured to said base box at diametrically opposite sides thereof, a cover having an opening for said utility meter, and a locking ring collar passing through said opening in said cover, said anchor member having:
  a pair of ends, a first of said ends having laterally spaced bifurcations for engagement with said meter stops to thereby provide a plurality of bearing points spaced relative to the opening in said cover,
  a second of said ends having an elongated slot formed therein for adjustable securement in said terminal block set adaptor,
  an offset connecting said first and said second ends of said anchor member.

8. The anchor member defined in claim 7 including an insulating coating thereon.

9. In an adaptor for modifying the female plug-in terminals of a plug-in terminal block set of a plug-in meter, comprising:
  a rigid insulating carrier means, a plurality of copper male conductor plug elements projecting on one side of said rigid insulating carrier means, a like plurality of female conductor socket elements each integrally formed with a respective one of said copper male conductor plug elements and constituted by a pair of opposing members having abutting facing legs projecting from the opposite side of said rigid insulating carrier means, and each of said female conductor socket elements having U-shaped spring member urging said abutting facing legs toward each other, respectively, so that when said male plug elements are simultaneously plugged into the female plug-in terminals of said terminal block set of a plug-in utility meter, each female conductor socket element and its U-shaped spring member thereby simultaneously loaded and have uniform pressure on male plug elements of said plug-in utility meter.

10. The adaptor defined in claim 9 wherein said male copper plug elements and said female conductor socket elements are formed of one integral piece of copper.

11. The adaptor defined in claim 9 including a spring pin passing through a hole in said male copper plug elements adjacent said rigid insulating carrier for retaining said elements in place.

* * * * *